US007132368B2

(12) United States Patent
Wang et al.

(10) Patent No.: US 7,132,368 B2
(45) Date of Patent: Nov. 7, 2006

(54) METHOD FOR REPAIRING PLASMA DAMAGE AFTER SPACER FORMATION FOR INTEGRATED CIRCUIT DEVICES

(75) Inventors: Mingching Wang, Shanghai (CN); Kuang-Yu Huang, Shanghai (CN); Chi-po Liao, Shanghai (CN); Yan-Shi Tian, Jilin Province (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 125 days.

(21) Appl. No.: 10/928,716

(22) Filed: Aug. 26, 2004
(Under 37 CFR 1.47)

(65) Prior Publication Data

US 2005/0287812 A1    Dec. 29, 2005

(30) Foreign Application Priority Data

Jun. 28, 2004    (CN) .................. 2004 1 0025739

(51) Int. Cl.
*H01L 21/311* (2006.01)
(52) U.S. Cl. ................. 438/696; 438/704; 257/E21.626
(58) Field of Classification Search ................ 438/696, 438/704, 723
See application file for complete search history.

(56) References Cited

U.S. PATENT DOCUMENTS 5,882,968 A * 3/1999 Jun ............................. 438/254
6,503,848 B1 * 1/2003 Chan et al. .................. 438/780
6,506,642 B1 * 1/2003 Luning et al. ............... 438/231
6,699,763 B1 * 3/2004 Grider et al. ................ 438/303
6,727,155 B1 * 4/2004 Yang et al. .................. 438/366
2005/0215008 A1 * 9/2005 Orlowski et al. ........... 438/257

* cited by examiner

*Primary Examiner*—W. David Coleman
(74) *Attorney, Agent, or Firm*—Townsend and Townsend and Crew LLP

(57) ABSTRACT

A method for processing integrated circuit memory devices. The method includes supporting a partially completed substrate, the substrate comprising a plurality of MOS gate structures. Each of the gate structures has substantially vertical regions that define sides of the gate structures. The method forms a conformal dielectric layer overlying the gate structures. The conformal dielectric layer has a predetermined thickness of material that covers each of the gate structures including vertical regions. The method also forms sidewall spacers on the sides of the gate structures from the conformal dielectric layer using an anisotropic etching process and exposes a portion of the substrate region during the formation of the sidewall spacers using the anisotropic etching process to cause physical damage (e.g., plasma damage, cracks) to a portion of the exposed portion of the substrate. The method smoothes exposed portions of the sidewall spacers and exposed portions of the substrate using at least a plasma treatment process including an isotropic etching component to the exposed portion of the substrate and sidewall spacers on the sides of the gate structures whereupon the exposed portion of the sidewall spacers result to a predetermined surface roughness value.

17 Claims, 4 Drawing Sheets

METHOD FOR REPAIRING PLASMA DAMAGE AFTER SPACER FORMATION FOR INTEGRATED CIRCUIT DEVICES

CROSS-REFERENCES TO RELATED APPLICATIONS

This application claims benefit to Chinese Patent Application No. 200410025739.4, filed on Jun. 28, 2004, and incorporated herein by reference.

STATEMENT AS TO RIGHTS TO INVENTIONS MADE UNDER FEDERALLY SPONSORED RESEARCH OR DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK.

NOT APPLICABLE

BACKGROUND OF THE INVENTION

The present invention is directed to integrated circuits and their processing for the manufacture of semiconductor devices. More particularly, the invention provides a method for repairing plasma damage after formation of side wall spacers on MOS device structures. But it would be recognized that the invention has a much broader range of applicability. For example, the invention can be applied to a variety of devices such as dynamic random access memory devices (DRAM), static random access memory devices (SRAM), application specific integrated circuit devices (ASIC), microprocessors and microcontrollers, Flash memory devices, and others.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility. Making devices smaller is very challenging, as each process used in IC fabrication has a limit. That is to say, a given process typically only works down to a certain feature size, and then either the process or the device layout needs to be changed. An example of such a limit is the ability to remove a layer and form structures from the removed layer without damaging the active device.

As merely an example, etching processes are often used to remove or partially remove a layer to form structures therefrom. Etching is often performed by an etching tool, such as a dry etcher or wet etcher. The wet etcher often includes a vessel that has an etchant chemical to selectively remove one material from another material. The dry etcher often includes a plasma source and treatment chamber. The dry etcher often uses gases such as fluorine bearing species and chlorine bearing species to remove semiconductor materials such as silicon or metal such as aluminum. Unfortunately, dry etchers often cause damage to underlying active regions in the substrate. Such damage is often difficult to see or even detect until the device has been completely fabricated. The defective device often results in yield loss and reliability problems of the device. Such defects are often difficult to uncover during processing and even more difficult to correct after detection such conventional semiconductor devices often goes through hundreds of processes that may lead to such defects.

From the above, it is seen that an improved technique for processing semiconductor devices is desired.

BRIEF SUMMARY OF THE INVENTION

According to the present invention, techniques for the manufacture of semiconductor devices are provided. More particularly, the invention provides a method for repairing plasma damage after formation of side wall spacers on MOS device structures. But it would be recognized that the invention has a much broader range of applicability. For example, the invention can be applied to a variety of devices such as dynamic random access memory devices (DRAM), static random access memory devices (SRAM), application specific integrated circuit devices (ASIC), microprocessors and microcontrollers, Flash memory devices, and others.

In a specific embodiment, the invention provides a method for processing integrated circuit devices, e.g., dynamic random access memory devices (DRAM), static random access memory devices (SRAM), application specific integrated circuit devices (ASIC), microprocessors and microcontrollers, Flash memory devices, and others. The method includes supporting a partially completed substrate, the substrate comprising a plurality of MOS gate structures. Each of the gate structures has substantially vertical regions that define sides of the gate structures. Each of the gate structures is formed on a surface of a substrate region. The method forms a conformal dielectric layer overlying the gate structures. The conformal dielectric layer has a predetermined thickness of material that covers each of the gate structures including vertical regions. The method also forms sidewall spacers on the sides of the gate structures from the conformal dielectric layer using an anisotropic etching process and exposes a portion of the substrate region during the formation of the sidewall spacers using the anisotropic etching process to cause physical damage (e.g., plasma damage, cracks) to a portion of the exposed portion of the substrate. The method applies a plasma treatment process including an isotropic etching component to the exposed portion of the substrate and sidewall spacers on the sides of the gate structures. The plasma treatment process has at least an etchant species of $CF_4$ and an $O_2$ bearing species to cause a smoothing action on the exposed portions of the sidewall spacers and the physical damage portion of the exposed portion of the substrate whereupon the exposed portion of the sidewall spacers result to a predetermined surface roughness value, e.g., >20 Angstroms.

In an alternative specific embodiment, the invention provides a method for processing integrated circuit memory devices. The method includes supporting a partially completed substrate, the substrate comprising a plurality of MOS gate structures. Each of the gate structures has substantially vertical regions that define sides of the gate structures. Each of the gate structures is formed on a surface of a substrate region. The method forms a conformal dielectric layer overlying the gate structures. The conformal dielectric layer has a predetermined thickness of material that covers each of the gate structures including vertical regions. The method also forms sidewall spacers on the sides of the gate structures from the conformal dielectric layer using an anisotropic etching process and exposes a portion of the substrate region during the formation of the sidewall spacers using the anisotropic etching process to cause physical damage (e.g., plasma damage, cracks) to a portion of the exposed portion of the substrate. The method smoothes exposed portions of the sidewall spacers and exposed portions of the substrate using at least a plasma treatment process including an isotropic etching component to the exposed portion of the substrate and sidewall spacers on the sides of the gate structures. The plasma treatment process has at least an etchant species of fluorine bearing species and an oxygen bearing species to cause a smoothing action on the exposed portions of the sidewall spacers and the physical damage portion of the exposed portion of the substrate whereupon the exposed portion of the sidewall spacers result to a predetermined surface roughness value.

Many benefits are achieved by way of the present invention over conventional techniques. For example, the present technique provides an easy to use process that relies upon conventional technology. In some embodiments, the method provides higher device yields in dies per wafer. Additionally, the method provides a process that is compatible with conventional process technology without substantial modifications to conventional equipment and processes. Preferably, the invention can be applied to a variety of applications such as memory, ASIC, microprocessor, and other devices. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

According to the present invention, techniques for the manufacture of semiconductor devices are provided. More particularly, the invention provides a method for repairing plasma damage after formation of sidewall spacers on MOS device structures. But it would be recognized that the invention has a much broader range of applicability. For example, the invention can be applied to a variety of devices such as dynamic random access memory devices (DRAM), static random access memory devices (SRAM), application specific integrated circuit devices (ASIC), microprocessors and microcontrollers, Flash memory devices, and others.

A method according to an embodiment of the present invention may be outlined as follows.
1. Provide substrate;
2. Form insulating layer overlying substrate;
3. Form gate structures on insulating layer;
4. Form blanket TEOS layer overlying gate structures;
5. Perform anisotropic etching of TEOS layer to form spacer structures on gate structures in a first chamber while biasing the substrate at a first voltage bias;
6. Perform soft etch process using a second voltage bias, which is less than the first voltage bias, in a second chamber;
7. Provide post etch cleaning;
8. Provide sacrificial oxide pre-cleaning process;
9. Form source/drain sacrificial oxide layer;
10. Pattern source/drain regions using masking process;
11. Perform source/drain implant; and
12. Perform other steps, as desirable.

As shown, the above sequence of steps provides a way of processing regions around source/drain and gate structures to improve processing efficiency and device yields. These steps are merely examples, which should not unduly limit the scope of the claims herein. One of ordinary skill in the art would recognize many other variations, modifications, and alternatives. Further details of these steps can be found throughout the present specification and more particularly below.

Figure 1:
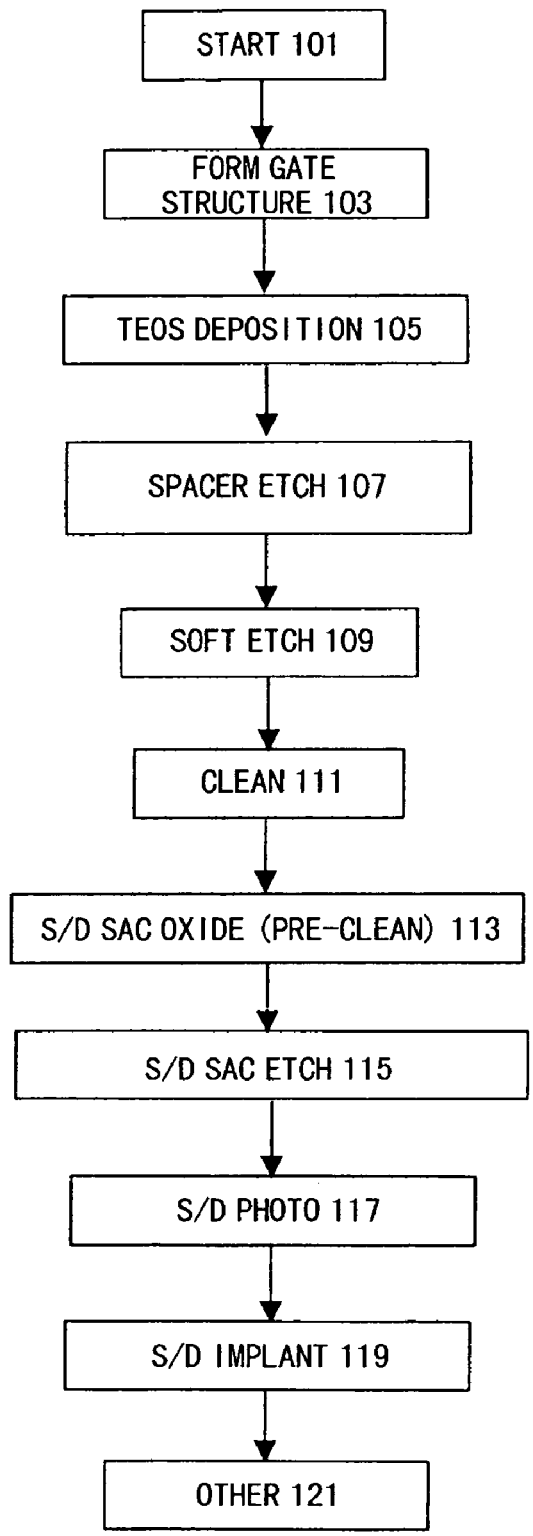
FIG. 1 is a simplified flow diagram illustrating a method according to an embodiment of the present invention.

FIG. 1 is a simplified flow diagram 100 illustrating a method according to an embodiment of the present invention. This diagram is merely an example, which should not unduly limit the scope of the claims herein. One of ordinary skill in the art would recognize many other variations, modifications, and alternatives. As shown, the method begins at start, step 101. Here, the method provides a partially completed substrate, which has a plurality of MOS gate structures 103. Each of the gate structures has vertical regions defining sides of the gate structures. Each of the gate structures is formed on a surface of a substrate region. Preferably, each of the gate structures has length of about 0.2 micron and less, although other dimensions are also possible.

The method includes forming a conformal dielectric layer 105 overlying the MOS gate structures. The conformal dielectric layer has a predetermined thickness of material that covers each of the MOS gate structures including vertical regions. Preferably, the conformal dielectric layer is an oxide material but can also be combinations of oxide and silicon nitride. The conformal layer is preferably TEOS or the like. Of course, there can be other types of materials used for the conformal dielectric layer.

Next, the method includes forming 107 sidewall spacers on the sides of the gate structures from the conformal dielectric layer using an anisotropic etching process. Preferably, etching occurs using a fluorine bearing species in a plasma etching tool, which is a first chamber. The method exposes a portion of the substrate region during the formation of the sidewall spacers using the anisotropic etching process to cause physical damage to a portion of the exposed portion of the substrate. The physical damage is generally enough to cause yield loss via electrical testing and also cause lower refresh times, if untreated. The physical damage is believed to be micro-openings in the conformal layer but can also be caused by other imperfections.

The method performs a soft etching, step 109, process. Preferably, soft etching occurs in a different chamber from the previous chamber. The soft etching process is performed by applying a plasma treatment process including an isotropic etching component to the exposed portion of the substrate and sidewall spacers on the sides of the gate structures. The plasma treatment process uses at least an etchant species of $CF_4$ and an $O_2$ bearing species, which dilute the fluorine bearing species. The diluted fluorine bearing species from the oxygen bearing species lessens or reduces a polymer formation from the fluorine bearing species. The diluted fluorine bearing species is believed to remove certain silicon bearing species and then deposits a silicon dioxide bearing species on the exposed portions of the sidewall spacers and the physical damage portion of the exposed portion of the substrate to cause a smoothing action of the exposed portions of the sidewall spacers and physical damage portion. The exposed portion of the sidewall spacers now have a resultant roughness that is less than or equal to a predetermined surface roughness value. Preferably, the predetermined roughness value is less than 5 Angstroms, but can be at other values as well.

The method then cleans (step 111) the sidewall spacer structure and gate structures of the substrate. Next, there are a variety of processes that are performed on the source/drain contact regions (S/D). The method performs a source/drain sacrificial oxide pre-clean, step 113. Next, the method performs a source/drain sacrificial oxide etching process, step 115. The method then performs a masking step 117 to expose the source/drain regions while protecting other regions of the partially completed integrated circuit devices. The method then performs a source/drain implant, step 119. Other steps (step 121) are then performed to complete the integrated circuit devices. Depending upon the embodiment, there can be other modifications, alternatives, and variations.

Figure 2:
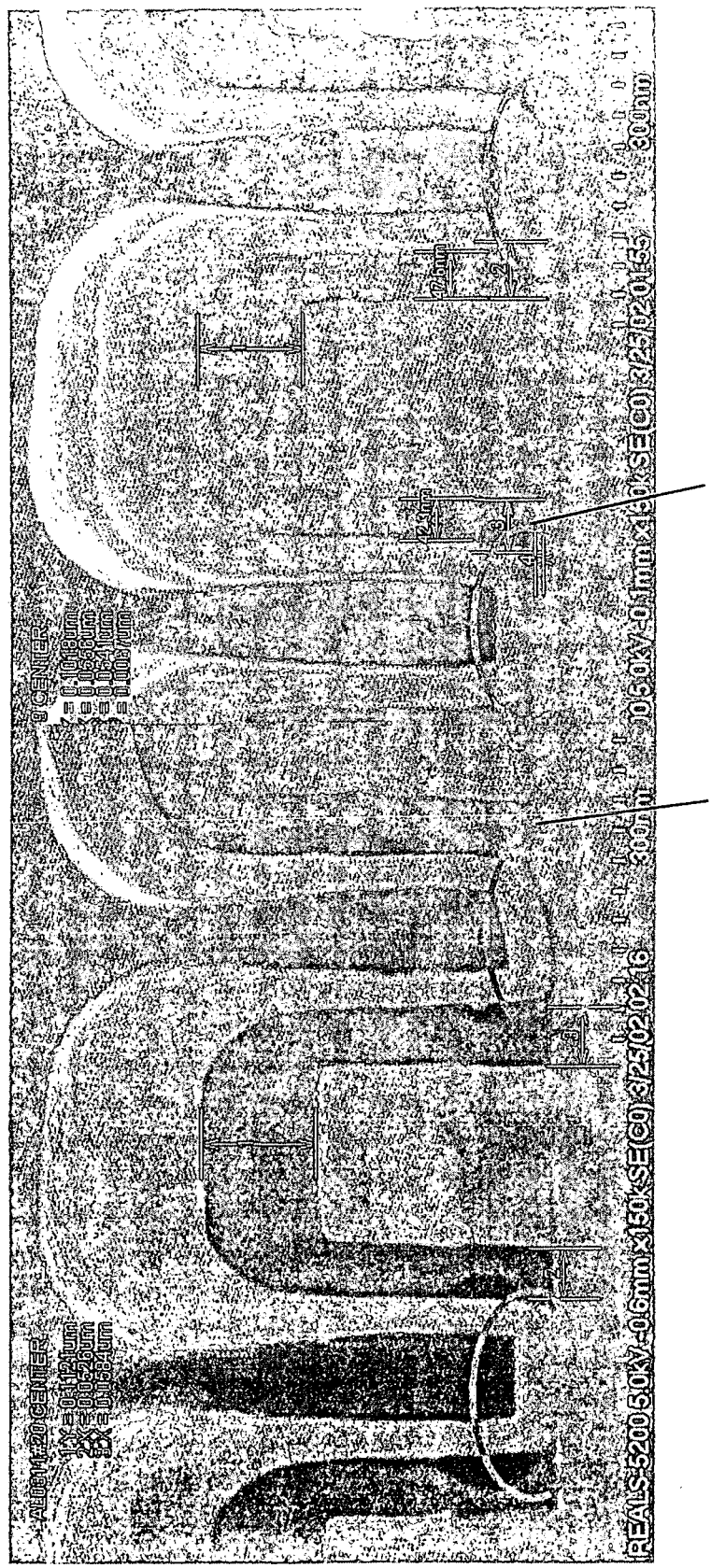
FIG. 2 is a simplified cross-sectional view of a semiconductor device according to an embodiment of the present invention.

FIG. 2 is a simplified cross-sectional view diagram of a semiconductor device according to an alternative embodiment of the present invention. This diagram is merely an example, which should not unduly limit the scope of the claims herein. One of ordinary skill in the art would recognize many other variations, modifications, and alternatives. As shown, the diagram illustrates a cross-sectional of an MOS device with no soft etch 200 and an MOS device with soft etch 201. As can be seen, soft etch results in better contact between the source/drain region and contact metal layer, as illustrated by reference numeral 207. The MOS device without soft etch has poor contact 205 between the source/drain region and the contact metal layer. As will be appreciated, these diagrams are merely illustrations and should not unduly limit the scope of the claims herein.

Figure 3:
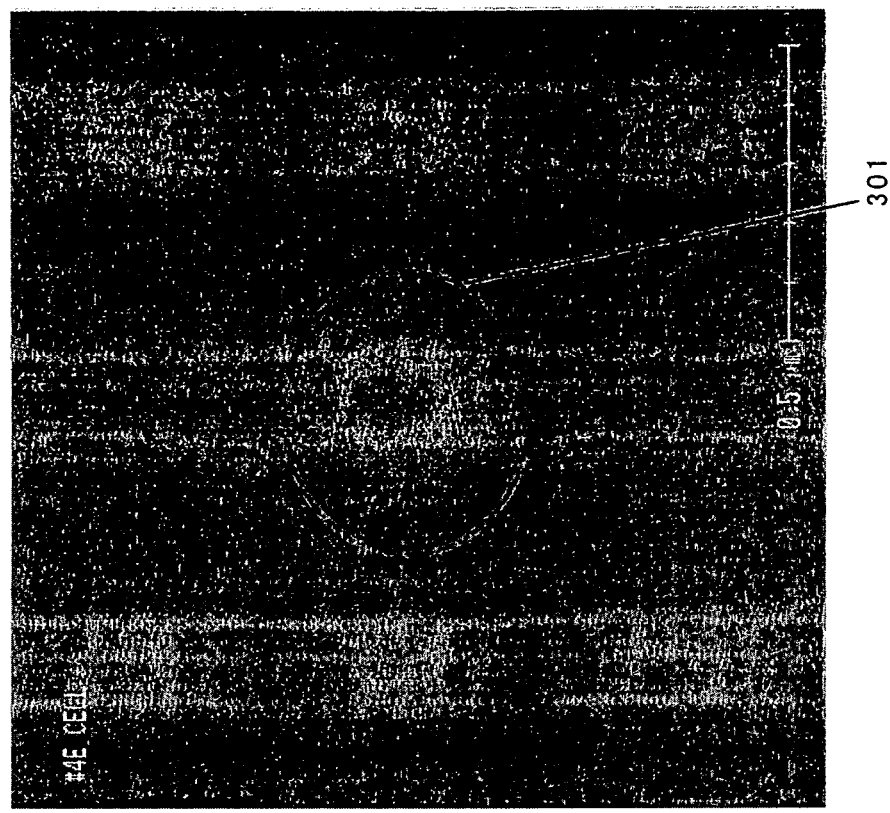
FIG. 3 is a simplified cross-sectional view of a semiconductor device according to an alternative embodiment of the present invention.
Figure 3:
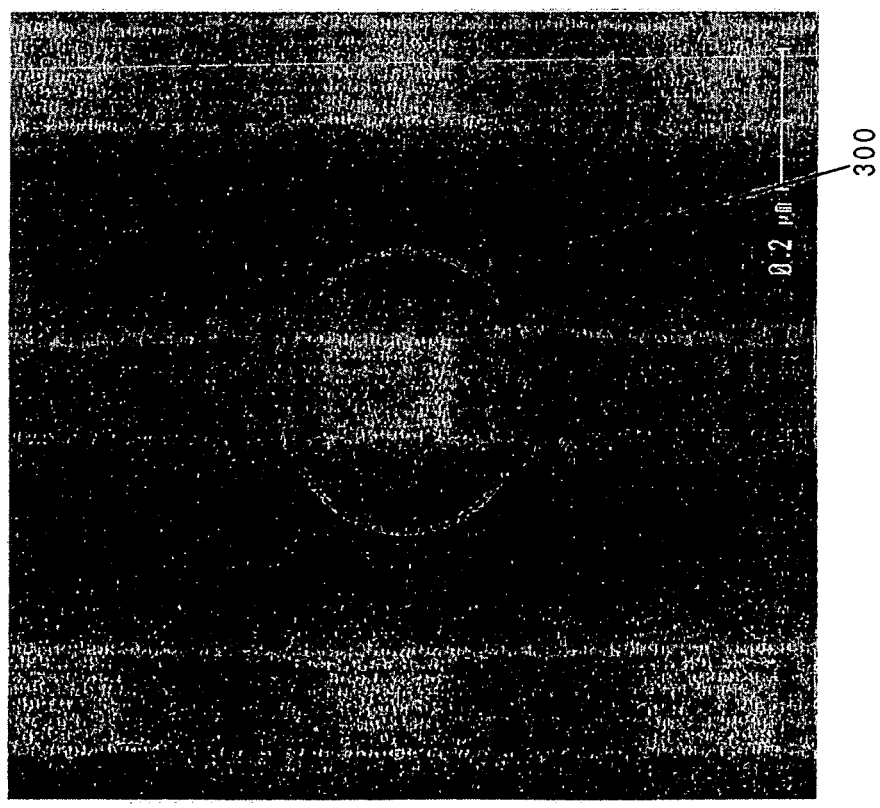

FIG. 3 is a simplified cross-sectional view diagram of a semiconductor device according to an alternative embodiment of the present invention. This diagram is merely an example, which should not unduly limit the scope of the claims herein. One of ordinary skill in the art would recognize many other variations, modifications, and alternatives. As shown, the diagram illustrates a top view diagram of an MOS device with no soft etch 300 and an MOS device with soft etch 301. As can be seen, soft etch results in better contact between the source/drain region and contact metal layer, as illustrated by reference numeral 301. The MOS device without soft etch has poor contact 300 between the source/drain region and the contact metal layer. As will be appreciated, these diagrams are merely illustrations and should not unduly limit the scope of the claims herein.

EXAMPLES

To prove the principle and operation of the present invention, we performed experiments using 0.2 micron design rule dynamic random access memory devices. The experiments used test wafers having MOS gate structures thereon. Test wafers were coated using LPTEOS over the gate structures at a deposition rate of 50 Angstroms per minute. Etching of the LPTEOS for spacer formation occurred using $CF_4$ gas at 15 SCCM and $O_2$ gas at 240 SCCM. Soft etching occurred using a down-stream microwave plasma etching tool. Such plasma etching tool was called the "Shibaura CDE" manufactured by Shibaura Ltd. of Japan. Certain experimental results have been provided. That is, under normal etch conditions (without soft etch), we achieved a refresh failure of 4.40 percent. Using soft etch, we achieved a 0.60 percent refresh failure, which was a significant improvement. Other data have been provided in reference to the Figure below.

Figure 4:
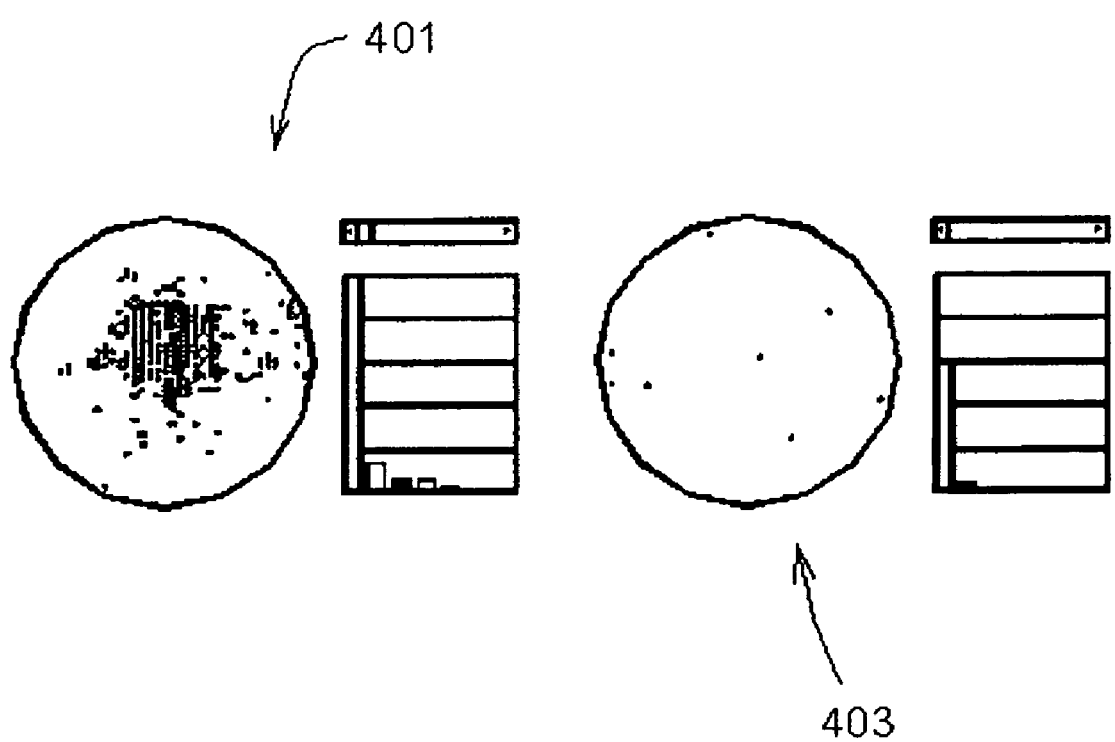
FIG. 4 is a simplified diagram of an experimental result according to an embodiment of the present invention

FIG. 4 is a simplified diagram of an experimental result according to an embodiment of the present invention. This diagram is merely an example, which should not unduly limit the scope of the claims herein. One of ordinary skill in the art would recognize many other variations, modifications, and alternatives. As shown, the results illustrate a wafer map 401 using normal conditions and a wafer map 403 with soft etch according to the present invention. As can be seen, the normal condition wafer map provided 81.05 percent yield, while the soft etch condition wafer map provided 96.95 percent yield. Failures are also illustrated. The normal wafer condition wafer map provided a center refresh failure and the soft etch wafer map provided no refresh failures. Of course, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for processing integrated circuit devices, the method comprising:

supporting a partially completed substrate, the substrate comprising a plurality of MOS gate structures, each of the gate structures having vertical regions defining sides of the gate structures, each of the gate structures being formed on a surface of a substrate region;

forming a conformal dielectric layer overlying the MOS gate structures, the conformal dielectric layer having a predetermined thickness of material that covers each of the MOS gate structures including vertical regions;

forming sidewall spacers on the sides of the gate structures from the conformal dielectric layer using an anisotropic etching process;

exposing a portion of the substrate region during the formation of the sidewall spacers using the anisotropic etching process to cause physical damage to a portion of the exposed portion of the substrate; and applying a plasma treatment process including an isotropic etching component to the exposed portion of the substrate and sidewall spacers on the sides of the gate structures, the plasma treatment process comprising at least an etchant species of $CF_4$ and an $O_2$ bearing species to dilute the fluorine bearing species to lessen a polymer formation from the fluorine bearing species, the etchant species causing a deposition of a silicon dioxide bearing species that causes a smoothing action on the exposed portions of the sidewall spacers and the physical damage portion of the exposed portion of the substrate whereupon the exposed portion of the sidewall spacers result to a predetermined surface roughness value.

2. The method of claim 1 wherein the physical damage causes a lower electrical yield and causes a lower refresh time, if the physical damage has been maintained; and wherein the plasma treatment process is maintained by a microwave plasma source.

3. The method of claim 2 wherein the plasma treatment process is provided by a TCP plasma tool.

4. The method of claim 1 further comprising implanting into the exposed substrate portions to introduce a dopant through the exposed substrate portions.

5. The method of claim 1 wherein the etching is provided in a first etching chamber and the applying is provided in a second etching chamber.

6. The method of claim 1 wherein the applying is maintained for about one minute or less or thirty seconds or less.

7. The method of claim 1 wherein the plasma treatment process removes a portion of the exposed substrate and removes a portion of the dielectric material on the sidewall spacers.

8. The method of claim 1 wherein the etching rate is 50 A per minute.

9. The method of claim 1 wherein each of the MOS gate structures has a channel dimension of about 0.2 micron and less.

10. The method of claim 1 wherein the etching and the applying are provided in the same chamber whereupon the applying has a reduced power to cause isotropic etching.

11. A method for processing integrated circuit memory devices, the method comprising:

supporting a partially completed substrate, the substrate comprising a plurality of MOS gate structures, each of the gate structures having vertical regions defining sides of the gate structures, each of the gate structures being formed on a surface of a substrate region;

forming a conformal dielectric layer overlying the MOS gate structures, the conformal dielectric layer having a predetermined thickness of material that covers each of the MOS gate structures including vertical regions;

forming sidewall spacers on the sides of the gate structures from the conformal dielectric layer using an anisotropic etching process;

exposing a portion of the substrate region during the formation of the sidewall spacers using the anisotropic etching process to cause physical damage to a portion of the exposed portion of the substrate, the physical damage causing a lower electrical yield and causing a lower refresh time, if the physical damage is left untreated; and smoothing the exposed portions of the sidewall spacers and the exposed portions of the substrate using at least a plasma treatment process including an isotropic etching component to the exposed portion of the substrate and sidewall spacers on the sides of the gate structures, the plasma treatment process comprising at least an etchant species of fluorine bearing species and an oxygen bearing species to cause a smoothing action on the exposed portions of the sidewall spacers and the physical damage portion of the exposed portion of the substrate whereupon the exposed portion of the sidewall spacers result to a predetermined surface roughness value.

12. The method of claim 11 wherein the etchant species is selected from $CF_4$, $C_xF_y$, or $SF_6$ or other gases.

13. The method of claim 11 wherein the etching is provided by maintaining a voltage bias to the substrate in a chamber and the smoothing is provided by reducing the voltage bias on the substrate.

14. The method of claim 11 wherein the etching and the smoothing are respectively provided in separate chambers.

15. The method of claim 11 wherein the predetermined roughness value is about 5 Angstroms and less.

16. The method of claim 11 wherein each of the MOS devices is coupled to a capacitor to form a memory device.

17. The method of claim 11 wherein the substrate is 200 mm and greater.

* * * * *